United States Patent
Lin (10) Patent No.: US 9,197,157 B1
(45) Date of Patent: Nov. 24, 2015

(54) ONE-PIN CRYSTAL OSCILLATOR DRIVEN THROUGH A GENERAL PURPOSE INPUT/OUTPUT DEVICE

(71) Applicant: Google Inc., Mountain View, CA (US)

(72) Inventor: Cheng-Yi Andrew Lin, Mountain View, CA (US)

(73) Assignee: GOOGLE INC., Mountain View, CA (US)

( * ) Notice: Subject to any disclaimer, the term of this patent is extended or adjusted under 35 U.S.C. 154(b) by 0 days.

(21) Appl. No.: 14/479,461

(22) Filed: Sep. 8, 2014

(51) Int. Cl.
   *H03B 5/36* (2006.01)

(52) U.S. Cl.
   CPC .................. *H03B 5/362* (2013.01); *H03B 5/36* (2013.01); *H03B 5/366* (2013.01); *H03B 2200/0008* (2013.01)

(58) Field of Classification Search
   CPC .......... H03B 5/36; H03B 5/362; H03B 5/364; H03B 5/366; H03B 2200/0008
   USPC ............................ 331/116 R, 116 FE, 158, 59
   See application file for complete search history.

(56) References Cited

U.S. PATENT DOCUMENTS

| | | | |
|---|---|---|---|
| 5,010,307 A | 4/1991 | Strandberg | |
| 5,606,295 A | 2/1997 | Ohara et al. | |
| 5,724,009 A | 3/1998 | Collins et al. | |
| 5,834,982 A * | 11/1998 | Watanabe et al. | 331/109 |
| 6,580,332 B2 * | 6/2003 | Sutliff et al. | 331/158 |
| 8,217,726 B2 * | 7/2012 | Sako et al. | 331/59 |
| 8,466,752 B2 * | 6/2013 | Kaufman et al. | 331/59 |
| 2008/0068107 A1 | 3/2008 | Luich | |

* cited by examiner

*Primary Examiner* — Ryan Johnson
(74) *Attorney, Agent, or Firm* — Morris & Kamlay LLP (57) ABSTRACT

Systems and techniques are disclosed for configuring a circuit containing a one-pin crystal oscillator in connection with a general-purpose input/output (GPIO) pad. The GPIO pad may be connected to on-chip circuitry such as a one-pin crystal oscillator circuit and input and output buffers. The techniques disclosed herein utilize the GPIO pad such that the GPIO pad can be used as the crystal pin for a one-pin crystal oscillator circuit, or the GPIO pad can be used as a general input or general output. If the GPIO pad is operated as a general output, an on-chip signal can be driven to off-chip components, such as instrumentation, other integrated circuits, etc. If the GPIO pad is operated as a general input, external signals can be driven to on-chip components, such as clock buffers, counters, etc.

34 Claims, 6 Drawing Sheets

ONE-PIN CRYSTAL OSCILLATOR DRIVEN THROUGH A GENERAL PURPOSE INPUT/OUTPUT DEVICE

BACKGROUND

Figure 1:
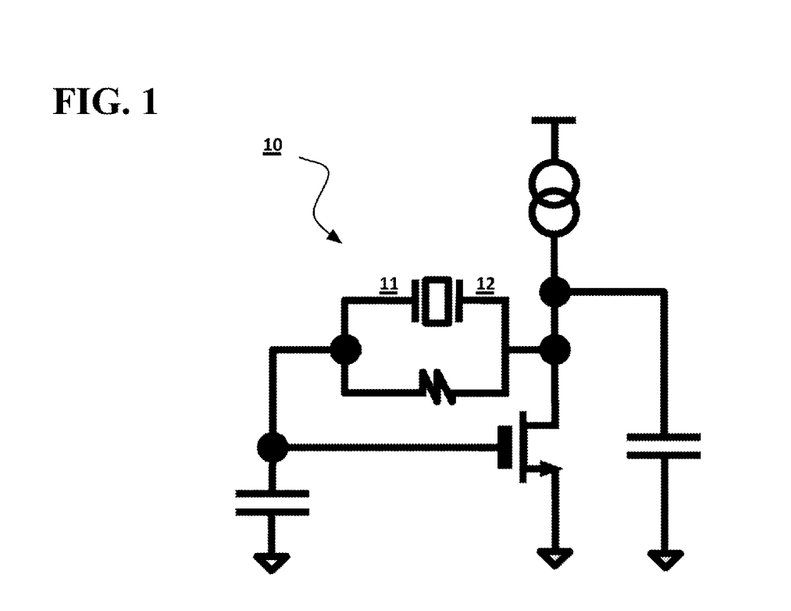
FIG. 1 shows a traditional implementation of a two-terminal, Pierce crystal oscillator.

A crystal oscillator is an electronic circuit that employs a piezoelectric material used to create precise and stable oscillatory voltage signals. An application for crystal oscillators is generating a clock signal that can be used for the timing of circuits. Traditionally, crystal oscillators are implemented as two-terminal components (e.g., Pierce crystal oscillators). The two terminals are often mapped to two pins on an integrated circuit (IC). As an example, the Pierce crystal oscillator shown in FIG. 1 contains a crystal oscillator including two terminals 11 and 12 such that both terminals are necessary to connect the crystal to the circuit. This requires two IC package pins. For IC designs with a limited number of package pins, it is beneficial to employ a crystal oscillator that utilizes one IC package pin. It is likely beneficial to utilize the same pin for additional functions.

BRIEF SUMMARY

According to implementations of the disclosed subject matter, a circuit may contain a one-pin crystal oscillator that is in connection with a general-purpose input/output (GPIO) pad. One of the crystal terminals is connected at least to the GPIO pad and the GPIO pad is also in connection with at least the gate node of the crystal oscillator circuit. The crystal oscillator circuit may contain a tunable transconductance amplifier. The transconductance amplifier may contain a biasing circuit configured to generate a current to bias the transconductance amplifier, and the biasing current may, for example, be generated by transistors in parallel, each transistor biased to provide a fraction of the biasing circuit current. The tunable transconductance amplifier may comprise a variable feedback capacitor such that, for example, one terminal of the variable feedback capacitor is in connection with a first node of the first transistor and the other terminal of the variable capacitor is in connection with a second node of the first transistor.

Systems and techniques according to the present disclosure enable implementing a one-pin crystal oscillator in connection with a GPIO pad to minimize the consumption of area in an integrated circuit. Additional features, advantages, and implementations of the disclosed subject matter may be set forth or apparent from consideration of the following detailed description, drawings, and claims. Moreover, it is to be understood that both the foregoing summary and the following detailed description include examples and are intended to provide further explanation without limiting the scope of the claims.

BRIEF DESCRIPTION OF THE DRAWINGS

The accompanying drawings, which are included to provide a further understanding of the disclosed subject matter, are incorporated in and constitute a part of this specification. The drawings also illustrate implementations of the disclosed subject matter and together with the detailed description serve to explain the principles of implementations of the disclosed subject matter. No attempt is made to show structural details in more detail than may be necessary for a fundamental understanding of the disclosed subject matter and various ways in which it may be practiced.

DETAILED DESCRIPTION

Figure 6:
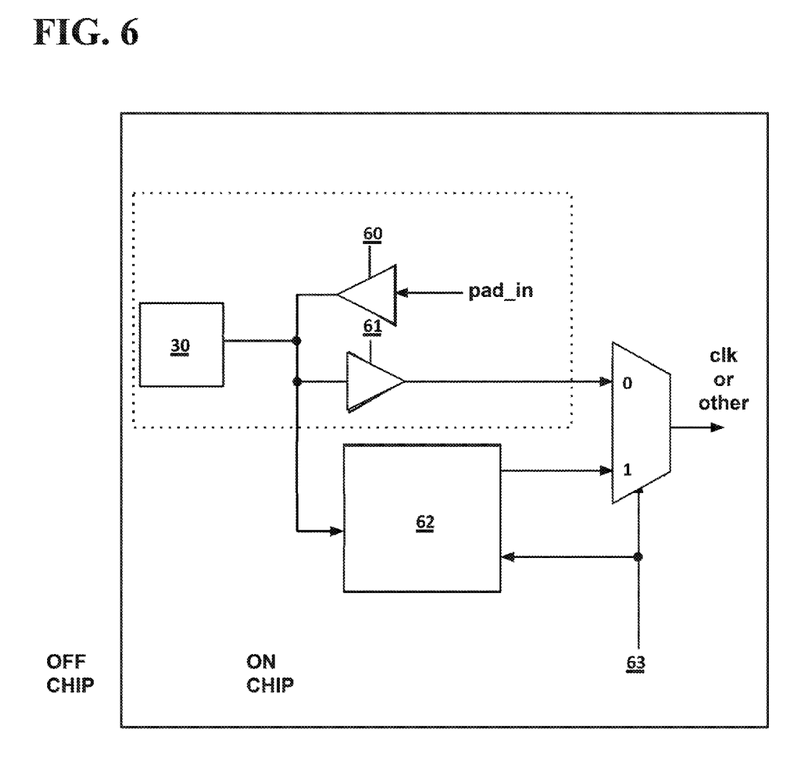
FIG. 6 shows a circuit implementation the GPIO pad connected to the one-pin crystal oscillator circuit and the input/output buffers according to an implementation of the disclosed subject matter.

According to techniques disclosed herein, a circuit may contain a crystal in connection with a general-purpose input/output (GPIO) pad. The GPIO pad can be connected to on-chip circuitry such as a one-pin crystal oscillator circuit and input/output buffers. The techniques disclosed herein utilize the GPIO pad to allow the use of a one-pin crystal oscillator, to propagate an off-chip signal on chip (general purpose input), and/or to propagate an on-chip signal off chip (general purpose output). The input/output buffers in connection with the GPIO pad may determine whether the GPIO pad is configured as a general-purpose input or a general-purpose output component. If the GPIO pad is operated to utilize the one-pin crystal oscillator, signal 63 is asserted, and signals 60 and 61 are de-asserted. This enables the one-pin crystal oscillator 62, disables the input and output buffers, and places the oscillatory signal from the oscillator to the output of the multiplexer. As an example, a one-pin crystal oscillator may provide a clock signal on-chip. A multiplexer may configure the crystal oscillator to transmit the clock signal on-chip based on the frequency of the clock signal. In certain implementations, a relay may be implemented between the GPIO pad and the crystal to provide isolation of the crystal component.

According to an implementation of the disclosed subject matter, it may also be possible to propagate an off-chip signal on-chip and to propagate an on-chip signal off-chip. If an off-chip signal is to be driven on-chip, signal 61 may be driven high to enable the input buffer while signal 63 is driven low. Such a state may be desired if an off-chip clock signal is appropriate for the timing of on-chip logic circuitry. When signal 63 is driven low, the one-pin crystal oscillator is disabled so that is does not load the pad, and the off-chip signal appears at the multiplexer output. Signal 60 is driven low so that the output of the buffer controlled by it is tri-stated and does not load the pad. If an on-chip signal is to be driven off-chip, signal 60 may be driven high to enable the output buffer while signals 63 and 61 are driven low, disabling the crystal oscillator circuit and the input buffer. This state may be desired if the on-chip signal provides data to be communicated to external circuitry.

Figure 2:
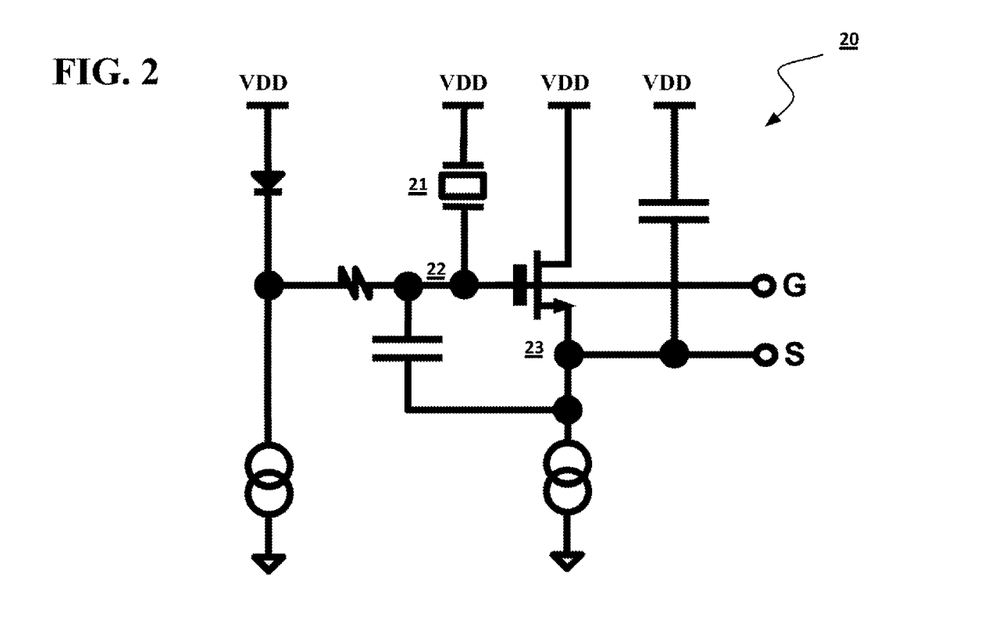
FIG. 2 shows a circuit implementation of a one-pin crystal oscillator according to an implementation of the disclosed subject matter.
Figure 3:
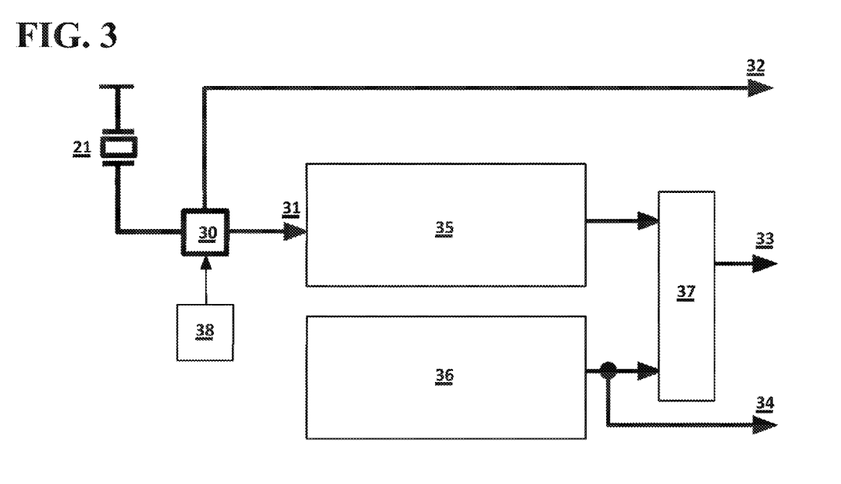
FIG. 3 shows a block diagram of a one-terminal crystal oscillator signal sent to peripheral circuitry through a GPIO pad according to an implementation of the disclosed subject matter.

According to implementations of the disclosed subject matter, a crystal oscillator may be implemented as a one-terminal component on an integrated circuit, thereby reducing area consumption and a package pin. As shown in FIG. 2, a crystal may be in connection with VDD (e.g., a positive power supply rail) as well as a single gate node 22. Because a separate probe is not required to measure VDD, only a single probe would be required to track the voltage across the crystal 21, reducing the need for an additional package pin and may, accordingly, reduce the area consumption. One-terminal of the crystal may be mapped to a pin on an integrated circuit, thereby creating a one-pin crystal oscillator wherein the oscillating signal of the component at the gate node 22 or at the source node 23 can be used within the integrated circuit. To further reduce area consumption, a general-purpose input/output (GPIO) pad 30 in FIGS. 3, 4, and 5, can be used for the crystal oscillator pin. Further reducing area consumption, the one-pin crystal oscillator employing GPIO pad 30 reduces the requirement of a separate pin for GPIO purposes when the crystal oscillator signal is not needed. As shown in FIG. 3, a component 38 (e.g., on-chip or off-chip component) may be in connection with the GPIO pad and provide a signal different from the crystal 21. For example, an external circuit and the integrated circuit may require a single clock to execute machine instructions. The crystal oscillator may be used to generate the clock when instructions require a certain processing rate. In cases when machine instructions need to be processed at a different rate, a clock with a frequency different than the frequency of the crystal oscillator signal may be required. In this case, the GPIO pad may be configured to disable the crystal oscillator and treat an external clock (e.g., not the crystal oscillator signal) as a general input to the integrated circuit to process the machine instructions at the different rate required. Alternatively, the frequency of the external signal may be below a frequency threshold such that the signal could be routed through the crystal oscillator. High frequency signals may not be able to be routed through the crystal oscillator due to the lowpass frequency characteristics of the crystal oscillator.

Figure 4:
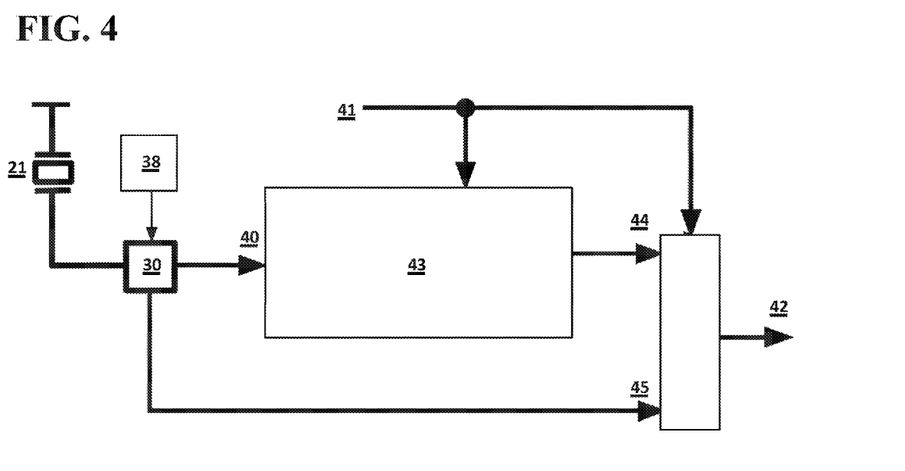
FIG. 4 shows a block diagram of a one-terminal crystal oscillator signal bypassing a one-pin crystal oscillator circuit according to an implementation of the disclosed subject matter.
Figure 5:
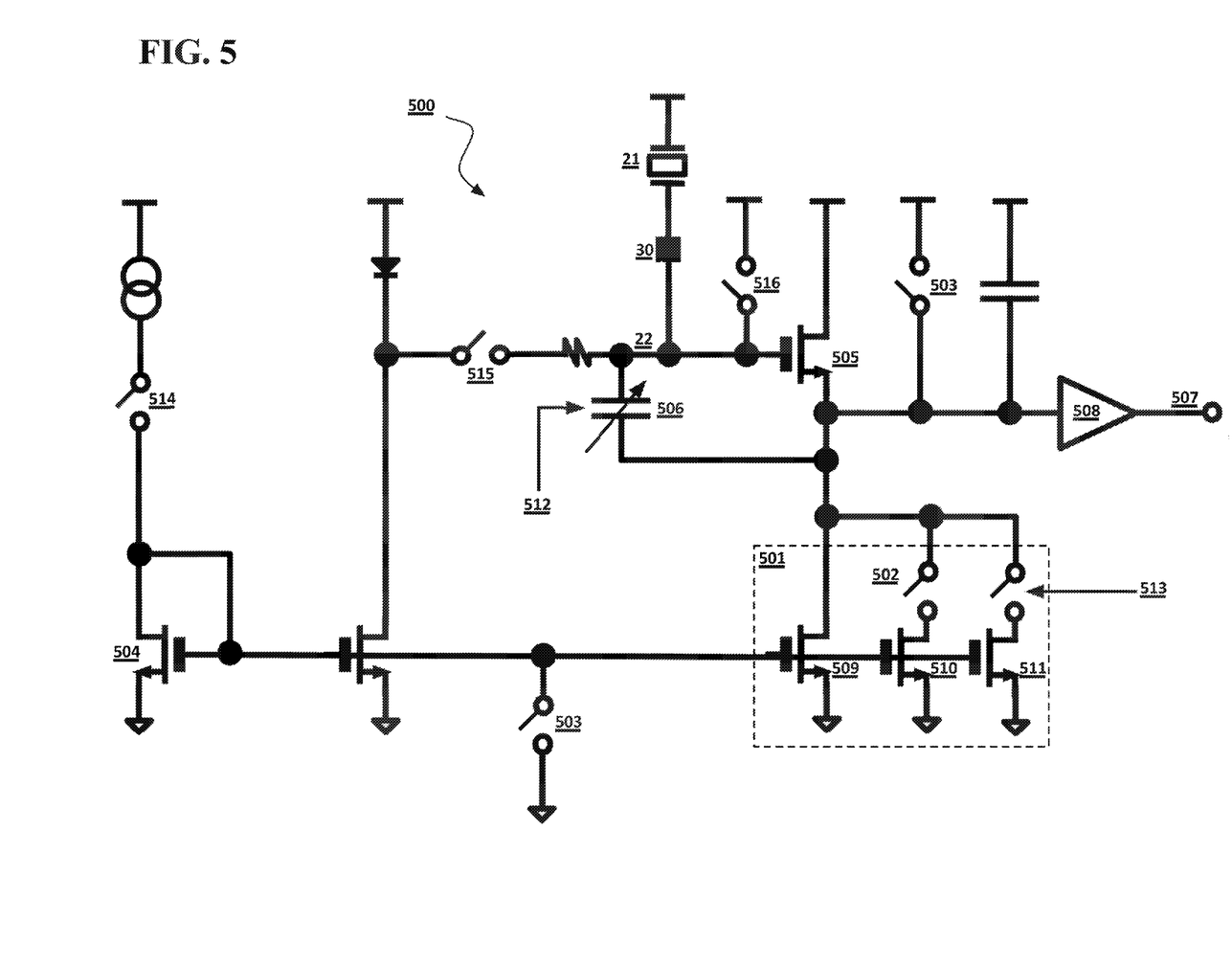
FIG. 5 shows an example one-pin crystal oscillator circuit with enable/disable capability in connection with a crystal according to an implementation of the disclosed subject matter.

A crystal oscillator and GPIO pad may be configured to work in conjunction with input/output buffers and a one-pin crystal oscillator circuit 35, 43, and 500 in FIGS. 3, 4, and 5, respectively. The input/output buffers may control whether the GPIO pad is in a state to receive input signals or in a state to generate output signals. A control signal can power up or power down the crystal oscillator.

According to an implementation of the subject matter disclosed herein, the one-pin crystal oscillator circuit utilizes a tunable transconductance amplifier. The tunable transconductance amplifier may require a DC bias to reliably operate the transconductance amplifier. A biasing circuit 501 may generate a bias current, which provides the DC bias to the transconductance amplifier. The biasing circuit may comprise a single transistor configured to generate the bias current. This single transistor may provide variable biasing currents by varying the terminal voltages of the transistor—the gate voltage, the source voltage, and/or the drain voltage. The variable biasing current may have the capability of altering performance characteristics of the tunable transconductance amplifier such as bandwidth, gain, and power consumption.

According to an implementation, more than one transistor in the biasing circuit may be placed in parallel to each other as shown circuit 501 in FIG. 5. The bias current is the sum of the individual currents of the transistors that are parallel to each other. The parallel transistors comprising the biasing circuit may be configured to each produce equivalent drain-source current. Alternatively, the parallel transistors may be configured to each generate unique and different drain-source currents. In either implementation, the bias current for the transconductance amplifier contains the parallel combination of the currents due to the transistors in the parallel architecture.

According to an implementation of the disclosed subject matter, the configuration of the biasing circuit with parallel transistors may include switches in series with the transistors in parallel as shown by 502 in FIG. 5. A series switch may be implemented as a normally-open or normally-closed switch. More specifically, a switch may be implemented in an electromechanical architecture (e.g., a relay) or in an electrical architecture (e.g., a transmission gate, a single transistor configured to operate as a digital switch, etc.). The switch may be configured to enable and disable the contribution of the current due to the transistor that it is in series connection with. Selectively enabling and disabling specific contributions of the parallel reference currents may alter performance characteristics of the tunable transconductance amplifier such as bandwidth, gain, and power consumption.

According to an implementation of the disclosed subject matter, a switch to ground 503 may be implemented to shut off the biasing circuit 501. To enable the current contribution, the switch to ground 503 may be open such that there is a current mirror from 504. To disable the current contribution, the switch to ground 503 may be closed driving the gate potentials in the biasing circuit 501 to ground, and the current source switch 514 may be open. Shutting down the biasing circuit 501 may reduce power in situations when the transconductance amplifier and/or crystal oscillator is not needed.

According to an implementation of the disclosed subject matter, the tunable transconductance amplifier may contain the variable current generating biasing circuit 502, a transistor 505 and a feedback capacitor 506. The transistor may be implemented as a bipolar or as a field-effect transistor. The circuit in FIG. 5 shows the transistor implemented as an NFET. As shown, one-terminal of the feedback capacitor may be connected to the gate node of the transistor 505, while the other terminal of the feedback capacitor is in connection with the source node of 505.

According to an implementation of the disclosed subject matter, the feedback capacitor 506 may serve to adjust the crystal oscillator oscillation frequency. Varying loads to the GPIO pad 30 or to the output of the system 507 may require varying degrees of frequency adjustment. As such, the feedback capacitor 506 may be divided amongst multiple feedback capacitors in parallel, wherein the parallel combination of the capacitors equals the feedback capacitor.

The configuration of the capacitors in parallel may include switches in series with the capacitors. The series switch may be implemented as a normally-open or normally-closed switch. More specifically, the switch may be implemented in an electromechanical architecture (e.g., a relay) or in an electrical architecture (e.g., a transmission gate or a single transistor configured to operate as a digital switch). The switch may be configured to enable and disable the contribution of the capacitance due to the capacitor that it is in series connection with. Selectively enabling and disabling specific contributions of the parallel capacitance may alter the performance of the feedback allowing adjustment of the oscillation frequency.

In an implementation of the disclosed subject matter, a general input signal applied to the GPIO may be need to appear at the system output 507 in FIG. 5. If the GPIO signal does not exceed the bandwidth of the tunable transconductance amplifier, the signal may be fed directly to the tunable transconductance amplifier. The signal driven to the gate node of the tunable transconductance amplifier will appear at the source node, which will then appear at the output of the buffer 508 in FIG. 5. Alternatively, the signal may be determined to exceed the bandwidth of the tunable transconductance amplifier. In this case, the signal may be routed directly to the system output 507 or to the on-chip device requiring the signal through, for example, re-mappable architectures. In such an implementation and in reference to FIG. 5, switches 514, 515, 516, and the series switches on capacitor 506 may be open (in this way capacitor 506 does not load the pad), while switch 503 may be closed.

In an implementation of the disclosed subject matter, the one-pin crystal oscillator circuit can be configured in a manner such to enable outputting a signal internal to the integrated circuit. In such an implementation and in reference to FIG. 5, switches 514, 515, 516, and the series switches on capacitor 506 may be open (in this way capacitor 506 does not load the pad), while switch 503 may be closed. The switch may be implemented in an electromechanical architecture (e.g., a relay) or in an electrical architecture (e.g., a transmission gate or a single transistor configured to operate as a digital switch).

Figure 7:
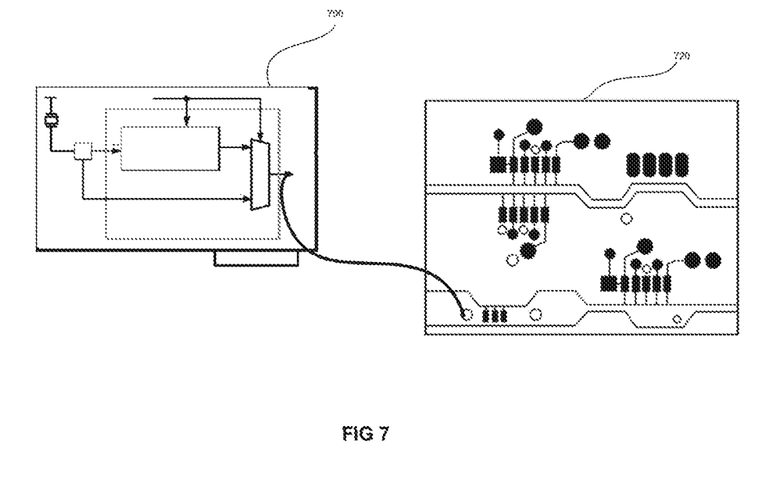
FIG. 7 shows a circuit in connection with a second circuit according to an implementation of the disclosed subject matter.
Figure 8A:
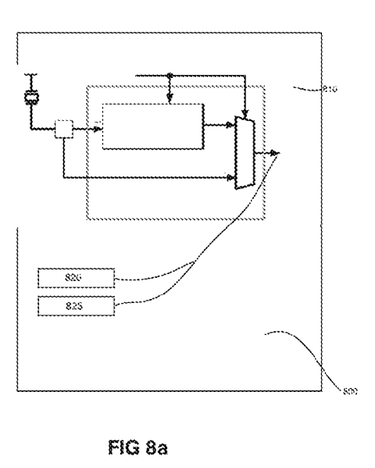
FIG. 8a shows a circuit contained within a computer tower, according to an implementation of the disclosed subject matter.
Figure 8B:
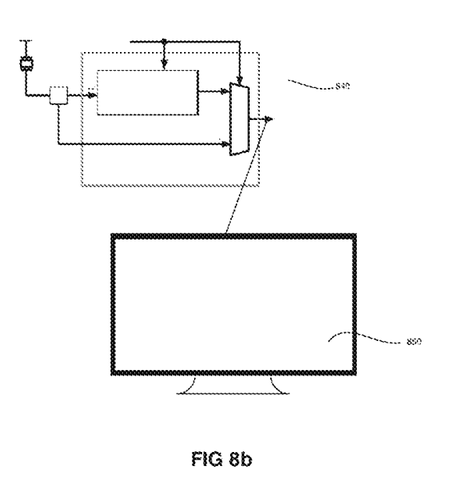
FIG. 8b shows a circuit in connection with a consumer product, according to an implementation of the disclosed subject matter.

Implementations of the presently disclosed subject matter may be implemented in and used with a variety of components and network architectures. The circuit disclosed herein may be used in integrated circuits, embedded devices, external circuits, computer and/or network components such as those shown in FIGS. 7 and 8. As shown in FIG. 7, a circuit 700 configured based on the techniques disclosed herein may be connected to a second circuit 720 that requires power to operate. The second circuit 720 may be connected to circuit 700 via any applicable technique such as a solder connection, fuse, wire, link, or the like. The circuit 700 may provide power to the second circuit 720 while maintaining stability within circuit 700.

As shown in FIG. 8a a computer tower 800 may contain a circuit 810 configured based on the techniques disclosed herein. The circuit 810 may be connected to one or more components housed within the computer tower 800 such as component 820 and 825. The circuit 810 may receive power from a power source and may distribute the power to the components 820 and 825 while maintaining stability within the circuit 810 via at least a variable resistive component. Similarly, as shown in FIG. 8b a circuit 840, configure according to techniques disclosed herein, may be connected to a consumer product such as a television 850. The circuit 840 may receive power from a power source and may distribute the power to the television 850 while maintaining stability within the circuit 840 via at least a variable resistive component.

The foregoing description, for purpose of explanation, has been described with reference to specific implementations. However, the illustrative discussions above are not intended to be exhaustive or to limit implementations of the disclosed subject matter to the precise forms disclosed. Many modifications and variations are possible in view of the above teachings. The implementations were chosen and described in order to explain the principles of implementations of the disclosed subject matter and their practical applications, to thereby enable others skilled in the art to utilize those implementations as well as various implementations with various modifications as may be suited to the particular use contemplated.

The invention claimed is:

1. A circuit comprising:
a crystal;
a general-purpose input/output (GPIO) pad in connection with the crystal; and
a one-pin crystal oscillator circuit containing a tunable transconductance amplifier having a gate node in connection with the GPIO pad.

2. The circuit of claim 1, wherein the tunable transconductance amplifier comprises a biasing circuit.

3. The circuit of claim 2, wherein the biasing circuit generates a current to bias the transconductance amplifier.

4. The circuit of claim 3, wherein the biasing circuit current is generated by a plurality of transistors connected in parallel, each transistor biased to provide a fraction of the biasing circuit current.

5. The circuit of claim 1, wherein the tunable transconductance amplifier comprises a variable feedback capacitor having N capacitors connected in parallel and a series switch.

6. The circuit of claim 4, wherein one terminal of at least one of the plurality of transistors is connected to a series switch to enable or disable the contribution of current provided by the at least one transistor to the biasing current.

7. The circuit of claim 4, wherein each of the plurality of transistors has a gate node and a source node and wherein a potential of a gate node of at least one of the transistors is equal to a potential of the source node.

8. The circuit of claim 1, wherein the tunable transconductance amplifier comprises a first transistor having a first node and a second node.

9. The circuit of claim 8, wherein the first transistor comprises at least one selected from the group consisting of: a NFET, and a PFET.

10. The circuit of claim 8, wherein the tunable transconductance amplifier comprises a variable feedback capacitor having a first terminal and a second terminal, the first terminal in connection with a first node of the first transistor and the second terminal in connection with a second node of the first transistor.

11. The circuit of claim 10, wherein the first node is one selected from the group consisting of: a source node, a drain node, a collector node, and an emitter node.

12. The circuit of claim 10, wherein the second node is one selected from the group consisting of: a gate node, and a base node.

13. The circuit of claim 10, configured to tune the variable feedback capacitor to a first setting if the one-pin crystal oscillator is active and to a second setting if the GPIO pad is active.

14. The circuit of claim 10, wherein the variable feedback capacitor is comprised of a plurality of capacitors connected in parallel each capacitor having two terminals.

15. The circuit of claim 14, further comprising a series switch coupled to a terminal of at least one of the plurality of capacitors to enable or disable the contribution of capacitance provided by the at least one of the plurality of capacitors connected in parallel.

16. The circuit of claim 1, wherein the output signal of the crystal is directly mapped to the output of the transconductance amplifier.

17. The circuit of claim 1, wherein the GPIO pad is in connection with an external device.

18. The circuit of claim 16, wherein the GPIO pad is adapted and configured to receive signals from within an embedded device and deliver the received signals to an external device.

19. The circuit of claim 1, configured to:
determine that the frequency of a signal driven onto the GPIO pad is below a frequency threshold; and
provide the signal to the tunable transconductance amplifier if the frequency is below the frequency threshold.

20. A system comprising:
a general-purpose input/output (GPIO) pad in connection with a crystal; and
a one-pin crystal oscillator circuit containing a tunable transconductance amplifier having a gate node in connection with the GPIO pad.

21. The system of claim 20, wherein the tunable transconductance amplifier comprises a biasing circuit.

22. The system of claim 21, wherein the biasing circuit generates a current to bias the transconductance amplifier.

23. The system of claim 22, wherein the biasing circuit current is generated by a plurality of transistors connected in parallel, each transistor biased to provide a fraction of the biasing circuit current.

24. The system of claim 20, wherein the tunable transconductance amplifier comprises a variable feedback capacitor having N capacitors connected in parallel and a series switch.

25. The system of claim 23, wherein one terminal of at least one of the plurality of transistors is connected to a series switch to enable or disable the contribution of current provided by the at least one transistor to the biasing current.

26. The system of claim 23, wherein each of the plurality of transistors has a gate node and a source node and wherein a potential of a gate node of at least one of the transistors is equal to a potential of the source node.

27. The system of claim 20, wherein the tunable transconductance amplifier comprises a first transistor having a first node and a second node.

28. The system of claim 27, wherein the tunable transconductance amplifier comprises a variable feedback capacitor having a first terminal and a second terminal, the first terminal in connection with a first node of the first transistor and the second terminal in connection with a second node of the first transistor.

29. The system of claim 28, configured to tune the variable feedback capacitor to a first setting if the one-pin crystal oscillator is active and to a second setting if the GPIO pad is active.

30. The system of claim 28, wherein the variable feedback capacitor is comprised of a plurality of capacitors connected in parallel each capacitor having two terminals.

31. The system of claim 30, further comprising a series switch coupled to a terminal of at least one of the plurality of capacitors to enable or disable the contribution of capacitance provided by the at least one of the plurality of capacitors connected in parallel.

32. The system of claim 20, wherein the output signal of the crystal is directly mapped to the output of the transconductance amplifier.

33. The system of claim 20, wherein the GPIO pad is in connection with an external device.

34. The system of claim 33, wherein the GPIO pad is adapted and configured to receive signals from within an embedded device and deliver the received signals to an external device.

* * * * *